(12) United States Patent
Lee

(10) Patent No.: US 8,507,936 B2
(45) Date of Patent: Aug. 13, 2013

(54) IMAGE SENSING DEVICE AND MANUFACTURE METHOD THEREOF

(75) Inventor: Hsiao-Wen Lee, Hsinchu (TW)

(73) Assignees: Visera Technologies Company Ltd., Hsinchu (TW); Omnivision Technologies Inc., Santa Clara, CA (US)

( * ) Notice: Subject to any disclaimer, the term of this patent is extended or adjusted under 35 U.S.C. 154(b) by 0 days.

(21) Appl. No.: 13/396,545

(22) Filed: Feb. 14, 2012

(65) Prior Publication Data

US 2012/0175501 A1 Jul. 12, 2012

Related U.S. Application Data

(62) Division of application No. 12/356,347, filed on Jan. 20, 2009, now Pat. No. 8,143,084, which is a division of application No. 11/395,046, filed on Mar. 30, 2006, now abandoned.

(30) Foreign Application Priority Data

Sep. 27, 2005 (TW) .............................. 94133609 A

(51) Int. Cl.
*H01L 33/00* (2010.01)

(52) U.S. Cl.
USPC ....... 257/98; 257/432; 257/433; 257/E31.127

(58) Field of Classification Search
USPC ............. 438/57; 257/432, 433, 43, E31.147, 257/E31.127, 98
See application file for complete search history.

(56) References Cited

U.S. PATENT DOCUMENTS

| 5,210,400 | A * | 5/1993 | Usami ....................... 250/208.1 |
| 5,682,266 | A * | 10/1997 | Meyers ......................... 359/571 |
| 6,033,766 | A | 3/2000 | Block et al. |
| 7,253,394 | B2 | 8/2007 | Kang |
| 2002/0135825 | A1* | 9/2002 | Lee et al. ...................... 358/509 |
| 2003/0044729 | A1 | 3/2003 | Huang et al. |
| 2004/0004668 | A1* | 1/2004 | Namazue et al. ............. 348/340 |
| 2005/0224694 | A1 | 10/2005 | Yaung |
| 2007/0015305 | A1* | 1/2007 | Lin et al. .......................... 438/69 |

FOREIGN PATENT DOCUMENTS

| JP | 03230567 | 10/1991 |
| JP | 08043605 | 2/1996 |
| JP | 2003015275 | 2/2003 |
| WO | 2005008781 | 1/2005 |

OTHER PUBLICATIONS

Office Action from European Application No. 06121131.4-1235, dated Sep. 24, 2012.

\* cited by examiner

*Primary Examiner* — Michael Trinh
(74) *Attorney, Agent, or Firm* — Haverstock & Owens LLP

(57) ABSTRACT

An image sensing device for receiving an incident light having an incident angle and photo signals formed thereby is provided. The image sensing device includes a micro prism and a micro lens for adjusting the incident angle and converging the incident light, respectively, a photo sensor for converting the photo signals into electronic signals, and an IC stacking layer for processing the electronic signals.

9 Claims, 15 Drawing Sheets

US 8,507,936 B2

IMAGE SENSING DEVICE AND MANUFACTURE METHOD THEREOF

This is a divisional of U.S. patent application Ser. No. 12/356,347, filed Jan. 20, 2009, now U.S. Pat. No. 8,143,084, which is a divisional of U.S. patent application Ser. No. 11/395,046, filed Mar. 30, 2006, now abandoned, the contents of which are hereby incorporated by reference.

FIELD OF THE INVENTION

The present invention refers to an optoelectronic device, in particular to a structure and arrangement of an image sensing device.

BACKGROUND OF THE INVENTION

Structure of Image Sensor

As the applications of the optoelectonic device become more and more popular, the demands for the image sensing device increase rapidly. In general, typical image sensors can be categorized into two main parts, which are the charge coupled device (CCD) and the complementary metal-oxide semiconductor (CMOS).

An image sensor is used for recording a change of a photo signal formed by an image and converting the photo signal into an electronic signal. After recording and processing the electronic signal, a digital image is generated for further outputting or recording. In general, the image sensor is formed by a plurality of photo sensing devices, which are either CCD elements or COMS elements.

A CCD image sensor is formed by a capacitor array having a plurality of metal oxide semiconductor (MOS) elements arranged densely. The manufacturing of the CCD is to deposit a silicon oxide layer on a N type (or P type) single crystal silicon substrate. Then, a PN type MOS capacitor receiving a photo signal is formed on the silicon oxide layer. The MOS capacitor is used for converting the photo signal into an electronic signal. Moreover, the dielectric layer and the signal transmitting circuit are arranged in the boundary of the MOS capacitor array and then integrated into the CCD elements on the single crystal substrate with the powering device. Thus, a CCD image sensor is accomplished.

On the other hand, the CMOS imager sensor is a semiconductor for recording the change of the photo signals. The CMOS mainly includes silicon (Si) and germanium (Ge), so that the N type and P type semiconductors can exist in the CMOS element. Therefore, the currents can be generated by these two complementary semiconductors. After processing and recording such currents, a digital image can be outputted or recorded. The difference between the CCD and CMOS is that the CCD element is formed on the single crystal semiconductor substrate while the CMOS element is formed on the metal oxide semiconductor substrate. However, the working principle of CCD and COMS are identical.

In addition to the abovementioned semiconductor photo sensing device included in the image sensor for converting the photo signals into electronic signals, a plurality of color filters are also included in the image sensor in order to output the color image. Typically, the color filter array included in the image sensor can be either the RGB color filter array or YMC color filter array.

In the conventional technology, the color filter array is disposed above the semiconductor photo sensing device. Furthermore, a micro lens array, such as a convex array, is disposed above the color filter array for converging or condensing the incident light. With the aid of the convex array, the incident light can be condensed to a smaller beam and projected to the specific area of the semiconductor photo sensing device, so as to increase the photosensitivity of the image sensor. Therefore, the typical arrangement of the image sensor, which is formed either by CCD or CMOS semiconductor photo sensing device, mainly includes a lens array, a color filter array and a semiconductor photo sensing device array arranged in sequence along a direction of the incident light.

Please refer to FIG. 1, which shows an arrangement of the conventional CMOS photo sensing element. As can be seen from FIG. 1, the CMOS photo sensing element 10 includes a substrate 11, a first photodiode 12a, a second photodiode 12b, a third photodiode 12c, a metal opaque layer 13, a first color filter layer 14a, a second color filter layer 14b, a third color filter layer 14c, a micro lens layer 15 and a light beam 16. Typically, the first, second and third color filter layers are used for filtering the green, red and blue light respectively.

No matter it is a CCD or a COMS image sensor, a plurality of photo sensing elements, which is also called pixels, are included therein for constructing a hundred thousand level or a million level image sensor. For a CCD image sensor, the electronic photo signals generated in every pixel of each column is transmitted to a buffer in sequence, and then outputted to an AC/DC (ADC) converter disposed near CCD photo sensing elements for amplifying and digitizing the analog electronic signals. The amplified and digitized signals are then transmitted to a processing chip. However, for a COMS image sensor, each pixels is collocated with an ADC converter, so as to amplify and digitize the electronic signal generated by each COMS pixel directly. Therefore, the main differences between the CMOS image sensor and the CCD image sensor are the disposition and the number of the ADC converter.

Please refer to FIG. 2, which shows the pixels layout of a CMOS image sensor, which includes a CMOS photo sensing element and an ADC converter in each pixel. As can be seen from FIG. 2, the CMOS image sensor 20 includes a plurality of pixels 21, each of which has a CMOS image sensor 22 and an ADC converter 23. The feature of the COMS image sensor is that each CMOS image sensor 22 is collocated with an ADC converter 22, so that the electronic signal generated by each COMS pixel can be amplified and digitized directly, and then transmitted to a processing chip for digital signals processing.

Optical Crosstalk, Brightness Difference and Pixel Layout Uniformity

No matter it is the CCD or CMOS image sensor being used, the optical crosstalk effect is always a problem to the designer of the image sensor. The optical crosstalk effect means the incident light transmitted into a pixel is deflected to the adjacent pixel(s), so that the additional photo energy is absorbed by the adjacent pixel(s) and thus the original photo energy which should be sensed by the adjacent pixel(s) will be affected by the deflected incident light.

Please refer to FIG. 3, which schematically explains the crosstalk effect of an image sensor. As can be seen from the FIG. 3, the conventional image sensor 30 includes a first, a second and a third micro lenses 31a-c, a first, a second and a third color filters 32a-c, a light shield 33, an IC stacking layer 34 and a first, a second and a third photodiodes 35a-c.

In a normal condition, a normal incident light 37a passing through the second micro lens 31b should be projected to and absorbed by the second photodiode 35b. However, in a crosstalk condition, a crosstalk incident light 37b having a larger incident angle 38b passing through the second micro lens 31b will be projected to and absorbed by the first photodiode 35a. Therefore, the crosstalk effect is dependent on the respective incident angles 38a, 38b of the incident lights 37a, 37b.

The brightness difference also results from the difference of the incident angle. The generated electrical signal in each photodiode is related to the sensed intensity of the incident light. However, the sensed intensity of the incident light varies with the incident angle of the incident light. Therefore, the incident angle also effects the brightness difference in each photodiode.

Please refer to FIGS. 12 and 13 which show the top views of two pixel layouts of the COMS image sensor, respectively. As can be seen from FIG. 12, an uniform decenter pixel array 110 includes a plurality of pixels 111, each of which includes a CMOS photodiode 112 and an ADC converter 113. The uniform decenter pixel array 110 further includes a micro lens array, so that each micro lens 114 is formed on each of the pixels 111 for converging the incident light into the CMOS photodiode 112. In such an uniform decenter pixel array 110, the pixel layout is manufactured in a 0.35 μm process, and the area ratio of the CMOS photodiode 112 to the ADC converter 113 in each pixel 111 is about 0.4~0.6. Since the photodiode 112 in each pixel 111 is disposed in the lower portion of the pixel, each micro lens 114 should be disposed decenteredly, so as to converge the incident light into the CMOS photodiode 112.

On the other hand, when the process of the CMOS pixel array is updated from the 0.35 μm process to the 0.13 μm one, an non-uniform decenter pixel array 120 is provided, as shown in FIG. 13. The non-uniform decenter pixel array 120 includes a plurality of pixels 121, each of which includes a CMOS photodiode 122 and an ADC converter 123. The non-uniform decenter pixel array 120 further includes a micro lens array, SQ that each of micro lens 124 is also formed on the each pixel 121 for converging the incident light into the photodiode 122. In such an non-uniform decenter pixel layout processed in 0.13 μm, four pixels are grouped into a pixel set, in which the four photodiodes 122 are disposed adjacent to one another and the ADC converters 123 are disposed around the four photodiodes 122 in each pixel set. However, the area ratio of the CMOS photodiode 122 to the ADC converter 123 in each pixel 121 is also maintained at about 0.4~0.6. However, since four photodiodes 122 in each pixel set are grouped together, the layout of the micro lens array 124 is changed to an non-uniform decenter layout, which may result in the overlapped layout of the micro lens array 124, as shown in FIG. 13.

Since the optical crosstalk effect, the brightness difference effect and the pixel layout uniformity are the factors affecting the image quality of the image sensor, most manufacturers are devoted themselves to find the solutions for improving the image quality of the image sensor. In the prior art, there are two known technical schemes which can be used for improving the image quality of the image sensor. The two technical schemes are described as follows.

Reference 1: Taiwan Patent No. TW200525773

An image sensor which can receive an uniform photo energy in a chip, especially in the areas between the central and the boundary of the chip, is provided in the reference 1. A further aspect of this image sensor is to provide an image sensor for solving the problem resulting from the photo crosstalk effect.

The image sensor provided in the reference 1 includes a micro lens layer having a plurality of micro lenses, each of which is corresponded to a sensing area of a sensor chip. The feature of such an image sensor is characterized in that the size of each micro lens is increased with the distance between the lens and the central of the sensor chip, so that the photo sensing uniformity in each sensing area of the sensor chip can be achieved.

Furthermore, please refer to FIG. 4, which shows a further image sensor layout provided in the reference 1 for abating the problem resulting from the photo crosstalk effect. As can been seen from FIG. 4, the lower part of the drawings is the conventional design of the image sensor, while the upper part of the drawings is the improved design of the image sensor. In the conventional design, each micro lens 42 is aligned with its corresponding color filter 43, IC stacking layer 44 and sensing area 45, respectively. However, in the improved design, the dispositions of the lenses are varied with their distance from the center of the sensor chip center. Since it is very complicated and inefficient to dispose every micro lenses, the micro lens layer 42 are categorized into several groups according to their distances from the center of the sensor chip center. As can been seen from FIG. 4, the micro lenses in the Group 1, which is adjacent to the center of the sensor chip, keep in the same disposition as those in the conventional design. As to Groups 2 and 3, which are further away from the center of the sensor chip, the micro lens set in each group are shifted (the shift distances in this case are 0.07 μm and 0.14 μm for Group 2 and Group 3, respectively) in a direction toward the center of the sensor chip, so that the effect results from different incident angles can be mitigated.

Reference 2: U.S. Pat. No. 6,803,250

In the reference 2, an image sensor with a complementary concave and convex lens layers is provided. Please refer to FIG. 5, which shows an image sensor structure provided in the reference 2. As can be seen from FIG. 5, the image sensor 50 includes a substrate 51 with a photoactive region 52 embedded therein. A first planarizing passivation layer 53 having a pair of patterned first conductor layers 54a, 54b formed therein and a second planarizing passivation layer 55 having a pair of patterned second conductor layers 56a, 56b formed therein are disposed above the substrate 51 in sequence. A color filter 58 is further disposed above the second planarizing passivation layer 55 with a first spacer layer 57 formed therebetween. A convex lens 510 is further disposed above the color filter 58 with a second spacer layer 59 formed therebetween. The first and second planarizing passivation layers 53, 55 are formed of a dielectric material transparent for adjusting the refraction angle of the incident light. With such a configuration described above, the first and second planarizing passivation layers 53, 55 are operated as a concave lens to be in combination with the convex lens 510 for enhancing the optical performance of the image sensor. However, such an image sensor still has the problem relating to the photo crosstalk effect and the brightness difference.

Base on the above, the conventional image sensors still have the problems in eliminating the crosstalk effect and the brightness difference. Therefore, it is necessary to provide a novel technical scheme to solve the abovementioned problems.

SUMMARY OF THE INVENTION

It is a first aspect of the present invention to provide an image sensing device receiving an incident light having an incident angle and photo signals formed thereby. The image sensing device includes a micro prism and a micro lens for adjusting the incident angle and converging the incident light, respectively, a photo sensor for converting the photo signals into electronic signals, and an IC stacking layer for processing the electronic signals.

Preferably, the incident light further having a chief ray angle (CRA) formed thereby, and the micro prism decreases the chief ray angle (CRA) of the incident light.

Preferably, the micro prism is formed by one of dielectric material and polymer material.

Preferably, the micro prism has a width in the order of micrometers, so is the photo senor.

Preferably, the image sensing device further includes an intermediate layer separating the micro lens and the micro prism for increasing the refraction of the incident light.

Preferably, the intermediate layer is formed by one selected from the group consisting of silicon dioxide, silicon nitride, silicon oxy-nitride and polymer material.

Preferably, the intermediate layer includes a plurality of spacers.

Preferably, the intermediate layer includes a plurality of color filters.

Preferably, the image sensing device along a direction of the incident light includes the micro lens disposed above the intermediate layer, the intermediate layer disposed above the micro prism, the micro prism disposed above the IC stacking layer, and the IC stacking layer disposed above the photo sensor.

Preferably, an arrangement of the image sensing device along a direction of the incident light includes the micro prism disposed above the intermediate layer, the intermediate layer disposed above the micro lens, the micro lens disposed above the IC stacking layer, and the IC stacking layer disposed above the photo sensor.

Preferably, the micro prism, the micro lens, and the photo sensor are configured in a non-decenter arrangement.

Preferably, the micro prism, the micro lens, and the photo sensor are configured in a decenter arrangement.

Preferably, the decenter arrangement includes a regular decenter arrangement and an irregular decenter arrangement.

Preferably, an arrangement of the image sensing device along a direction of the incident light includes the micro prism disposed above the micro lens, the micro lens disposed above the IC stacking layer, and the IC stacking layer disposed above the photo sensor.

It is a further aspect of the present invention to provide a method for manufacturing an image sensing device. The method includes the steps of providing a substrate, forming a photo sensor on the substrate by a first IC process, forming an IC stacking layer on the photo sensor by a second IC process, forming a micro lens on the IC stacking layer by a first integrated optical process, and forming a micro prism on the micro lens by a second integrated optical process.

It is a further aspect of the present invention to provide a method for manufacturing an image sensing device. The method includes the steps of providing a substrate, forming a photo sensor on the substrate by a first IC process, forming an IC stacking layer on the photo sensor by a second IC process, forming a micro prism on the IC stacking layer by a first integrated optical process, forming an intermediate layer on the micro prism by second integrated optical process, and forming a micro lens on the intermediate layer by a third integrated optical process.

It is a further aspect of the present invention to provide a method for manufacturing an image sensing device. The method includes the steps of providing a substrate, forming a photo sensor on the substrate by a first IC process, forming an IC stacking layer on the photo sensor by a second IC process, forming a micro lens on the IC stacking layer by a first integrated optical process, forming an intermediate layer on the micro lens by a second integrated optical process; and forming a micro prism on the intermediate layer by a third integrated optical process.

Preferably, the substrate is a semiconductor substrate.

Preferably, the micro prism is made of a dielectric material which is pervious to light.

Preferably, the micro prism is manufactured by one selected from the group consisting of gray masking process, photoresist process and etching process.

Preferably, the intermediate layer is manufactured by one selected from the group consisting depositing one of silicon oxide, silicon nitride and silicon oxynitride with PECVD process.

Preferably, the intermediate layer is made of polymer material.

It is a further aspect of the present invention to provide an image sensing module including a package lid, a plurality of micro prisms disposed on the package lid and adjusting an incident angle of an incident light, and a plurality of photo sensors converting the photo signals of the incident light into the electronic signals.

Preferably, each of the plurality of photo sensors includes a micro lens integrated therewith.

Preferably, a chief ray angle (CRA) of the incident light is adjusted by varying a dimension of each of the plurality of micro prisms.

Preferably, each of the plurality of micro prisms is formed by one of dielectric material and polymer material.

Preferably, each of the plurality of micro prisms has a width in the order of micrometers.

Preferably, a dimension of each of the plurality of micro prisms is varied with its position in the package lid.

BRIEF DESCRIPTION OF THE DRAWINGS

The above objects and advantages of the present invention will become more readily apparent to those ordinarily skilled in the art after reviewing the following detailed descriptions and accompanying drawings, in which.

DETAILED DESCRIPTION OF THE PREFERRED EMBODIMENT

The present invention will now be described more specifically with reference to the following embodiments. It should to be noted that the following descriptions of preferred embodiments of this invention are presented herein for purposes of illustration and description only; it is not intended to be exhaustive or to be limited to the precise form disclosed.

In an image sensing device according to the present invention, a micro prism array is incorporated thereinto, so that the light with a larger chief ray angle, which is an angle between the incident light and the vertical line, can be adjusted to a light with a smaller incident angle for decreasing the optical crosstalk effect among adjacent pixels of the image sensing device.

Figure 1:
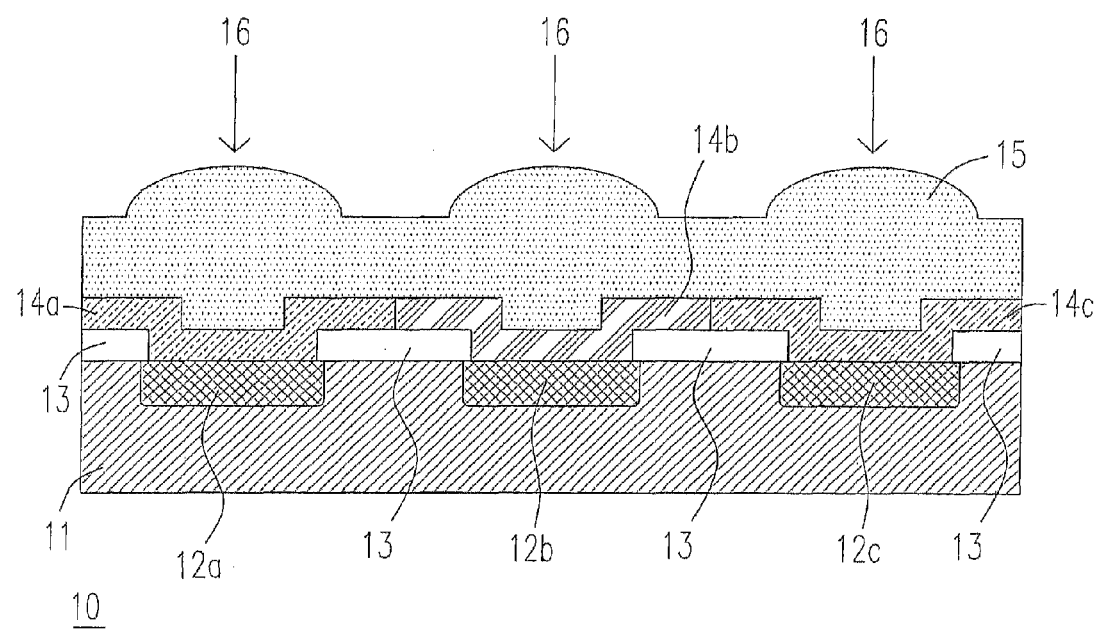
FIG. 1 shows an arrangement of the conventional CMOS photo sensing element.
Figure 2:
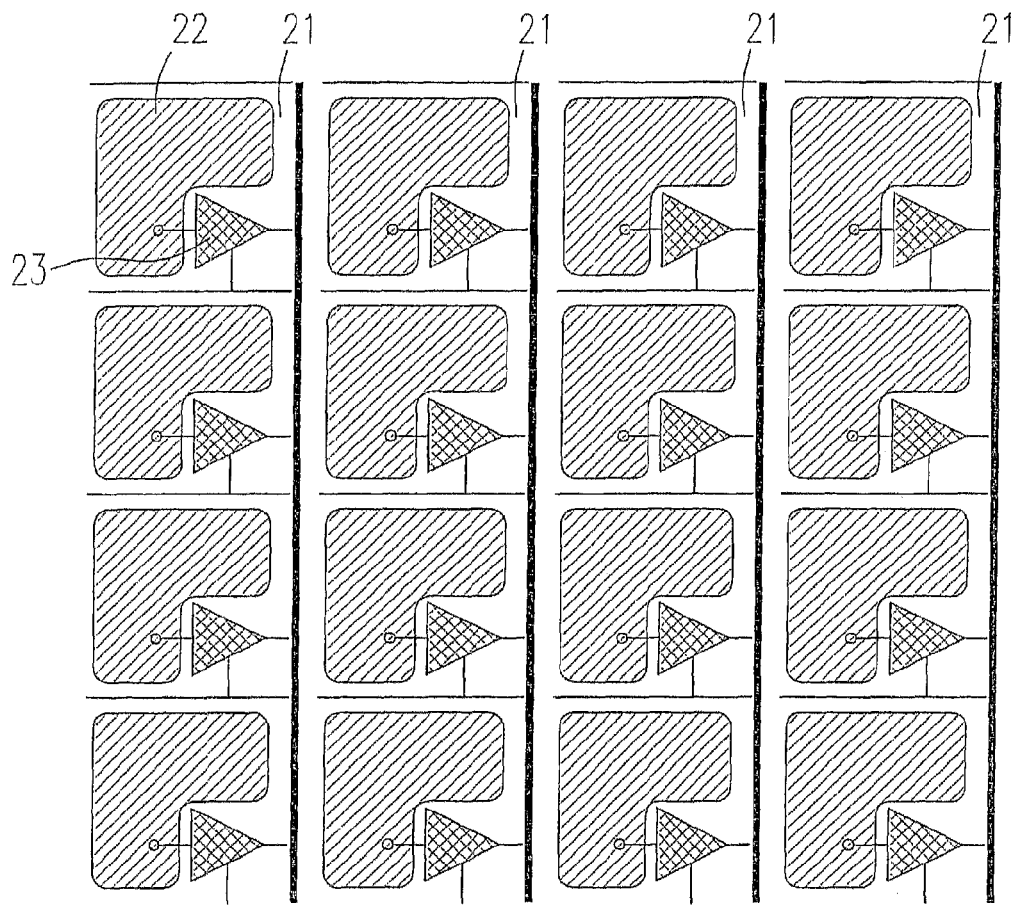
FIG. 2 shows the pixels layout of a CMOS image sensor according to the prior art.
Figure 3:
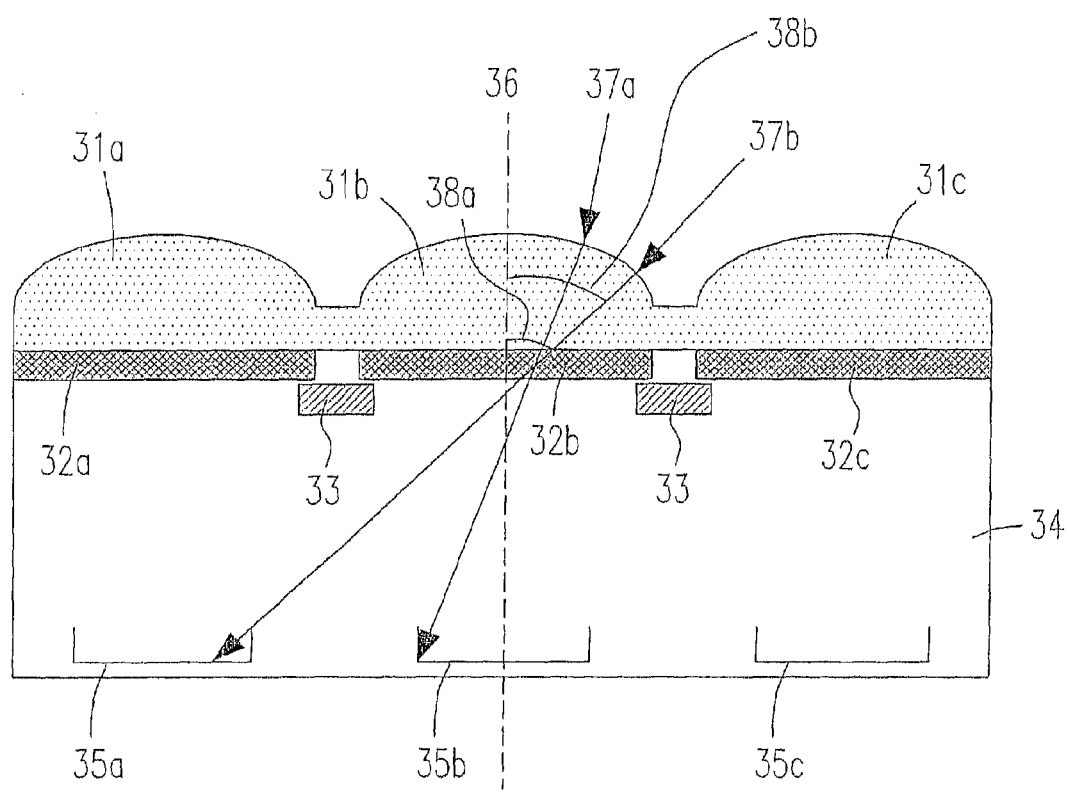
FIG. 3 schematically explains the crosstalk effect of an image sensor.
Figure 4:
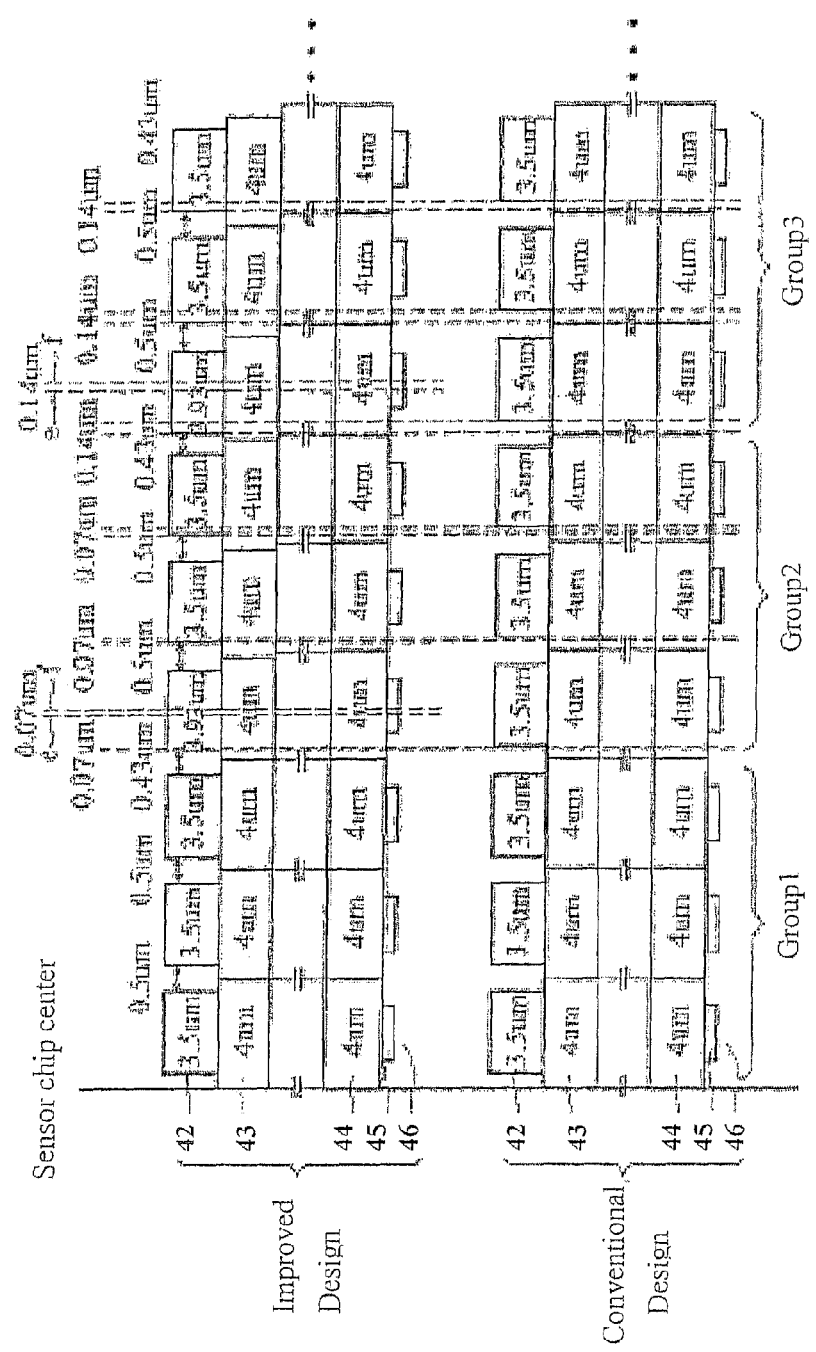
FIG. 4 shows a further image sensor layout according to the prior art.
Figure 5:
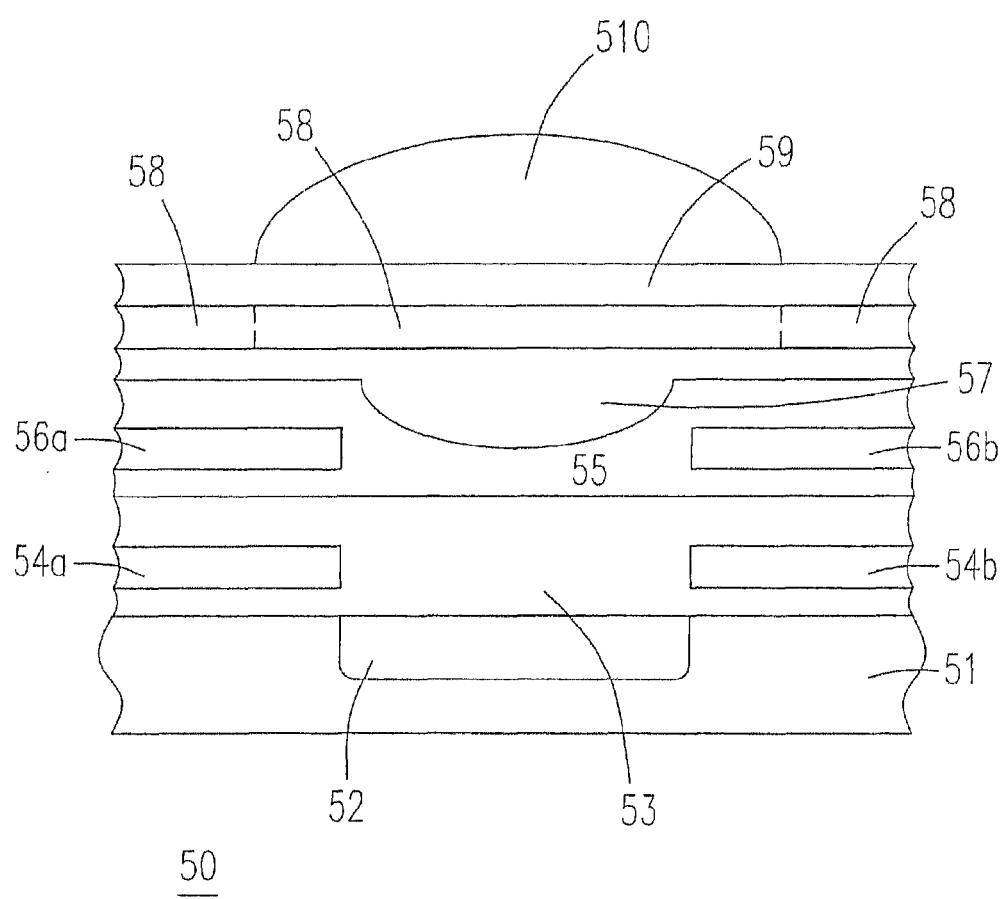
FIG. 5 shows a further image sensor structure according to the prior art.
Figure 6:
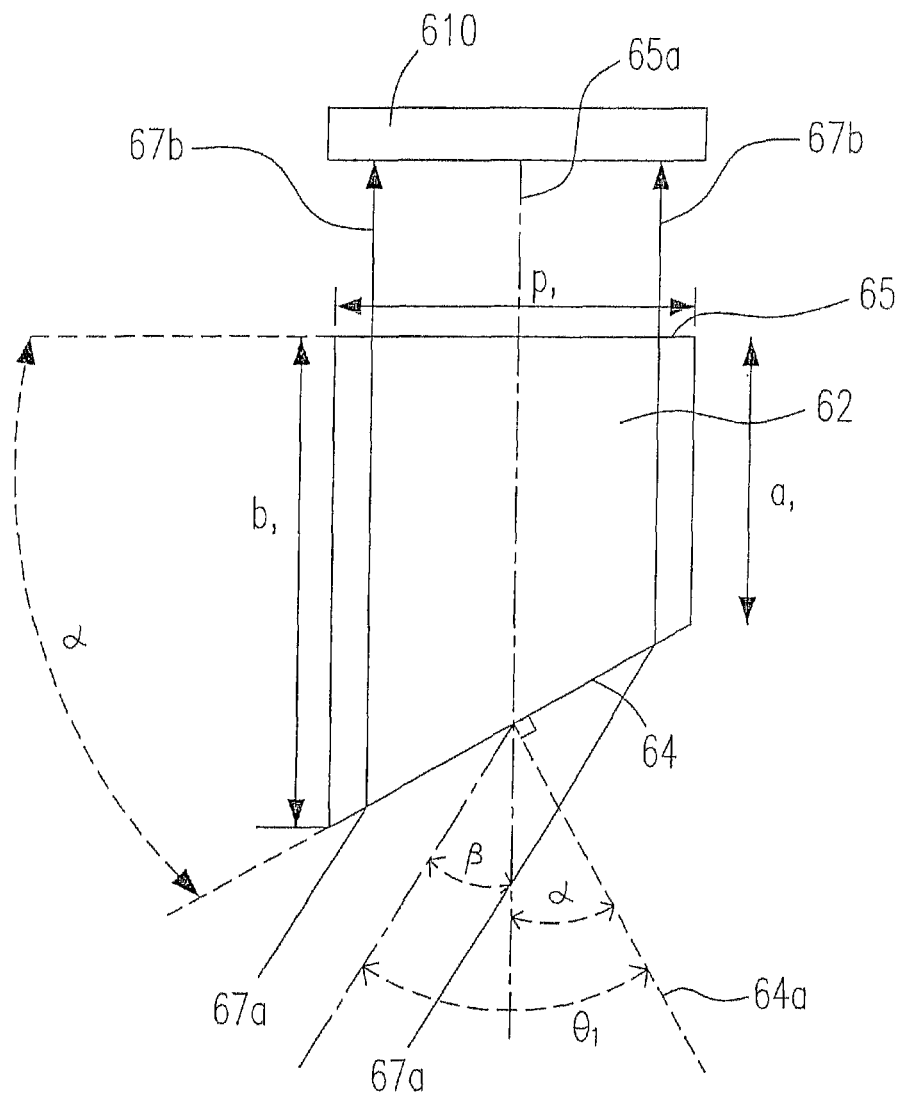
FIG. 6 schematically explains the working principle of a micro prism.

Please refer to FIG. 6, which schematically explains the working principle of a micro prism. The micro prism 62 has an inclined angle α, which is defined by the angle between the normal 64a of the entrance plane 64 and the vertical line 65a. The inclined angle α of the micro prism 62 can also be defined and adjusted with the dimension of the micro prism 62. As can be seen from FIG. 6, the inclined angle α is the function of a first side a, a second side b and a third side p of the micro prism 62, which satisfies the following equation:

$$\alpha = \tan^{-1}[(b-a)/p] \quad (1)$$

When an incident light 67a with a chief ray angle β enters the entrance plane 64 of the micro prism 65, the transmission direction of the incident light will follow Snell's Law: $n_1 \sin \theta_1$, wherein $n_2 \sin \theta_2$, wherein $n_1$ denotes the refractive index of the medium (air) outside the micro prism 62, $\theta_1$ denotes the incident angle of the light entering the entrance plane 64 of the micro prism 62, $n_2$ denotes the refractive index of the micro prism 62, and $\theta_2$ denotes the refractive angle of the light entering the entrance plane 64. Since the normal of the entrance plane 64 of the micro prism 62 is inclined an angle α. with respect to the vertical line 65a, the incident angle $\theta_1$ of the light entering the entrance plane 64 should be equaled to the sum of the inclined angle α and the chief ray angle β, this is to say: $\theta_1 = \alpha + \beta$; In most cases, it is preferable to make the incident light 67a with a chief ray angle β entering the entrance plane 64 of the micro prism 65 be deflected to the light parallel to the vertical line 65a when transmitting through the micro prism 62. Therefore, the refractive angle $\theta_2$ should be controlled to be equaled to the inclined angle α. That is to say, the micro prism 62 of the present invention is used to deflect an light with an chief ray angle β entering the micro prism 62 to an exit light 67b which is parallel to the vertical line 65a. Since the incident light with an larger chief ray angle can be decreased and the distribution of the light energy can also be uniformed with the aid of the micro prism, the problems of the image sensor resulting from the crosstalk effect and brightness difference can be overcome.

It should be noted that the installation of the micro prism is applicable to various types or different configurations of the image sensors. Furthermore, it is also advantageous that the inclined angel a of the micro prism can be adjusted by changing the dimension thereof. Since the chief ray angle of the incident light can be varied in each pixel of the image sensor, the dimension of the micro prism corresponding to each pixel can be varied depending on its position. Moreover, since the dimension of each pixel of the image sensor is in the order of micrometers, the dimensions of the incorporated micro prism and other optical elements in each pixel are also in the order of micrometers. The manufacturing process of the image sensor of the present invention is compatible with the known IC processes and integrated optical processes.

Figure 7:
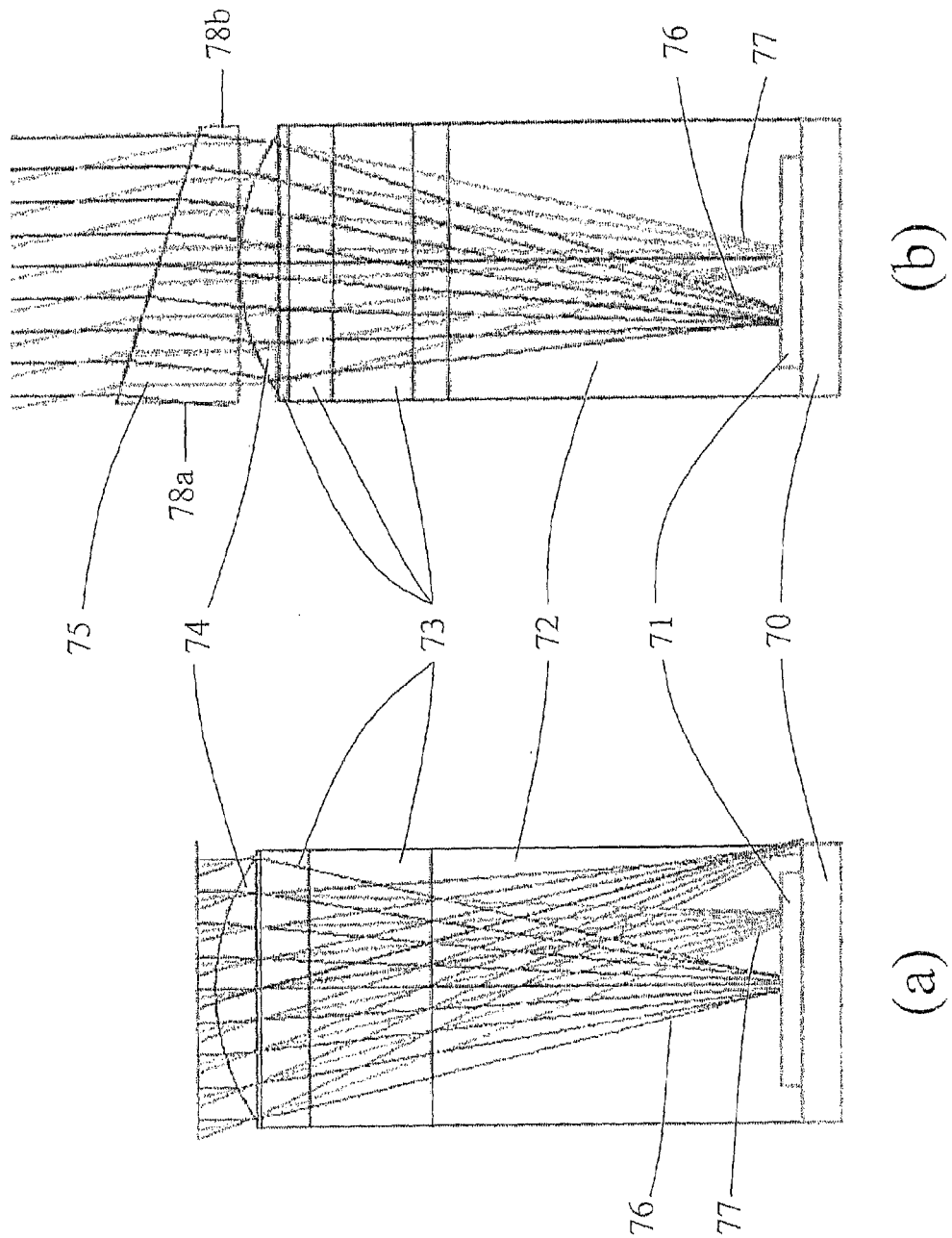
FIG. 7 schematically shows the structure of an image sensor according to a first embodiment of the present invention.

Please refer to FIG. 7, which schematically shows the structure of an image sensor according to a first embodiment of the present invention. For clarity, a conventional image sensor structure is also shown in FIG. 7 for explicitly expressing the difference of these two image sensor structures. As can be seen from FIG. 7, the part (a) is a typical structure of the conventional image sensor, while the part (b) is the structure of the image sensor according to the first embodiment of the present invention. Both of the two structures include a substrate 70 having a photo sensor 71 and an IC stacking layer 72 sequentially formed thereon. Preferably, the substrate 70, the photo sensor 71 and the IC stacking layer 72 are manufactured by a compatible IC process. Above the IC stacking layer 72, it is incorporated with the optical elements, such as at least one intermediate layer 73 and a micro lens 74, which are formed by a compatible integrated optical process. As having been described above, the main difference between the image sensor structure according to this embodiment of the present invention and the conventional image sensor structure is the installation of the micro prism 75. In this embodiment, the micro prism 75 is formed above the micro lens by the integrated optical process. With the installation of the micro prism, the larger chief ray angle (for example 20°) of an incident light 77 can be adjusted to a smaller one (for example, 0°, which means the direction of the light exiting the exit plane of the micro prism is perpendicular to the exit plane of the micro prism) when the light exits from the micro prism 75, so as to decrease the crosstalk effect among the adjacent pixels.

Figure 8:
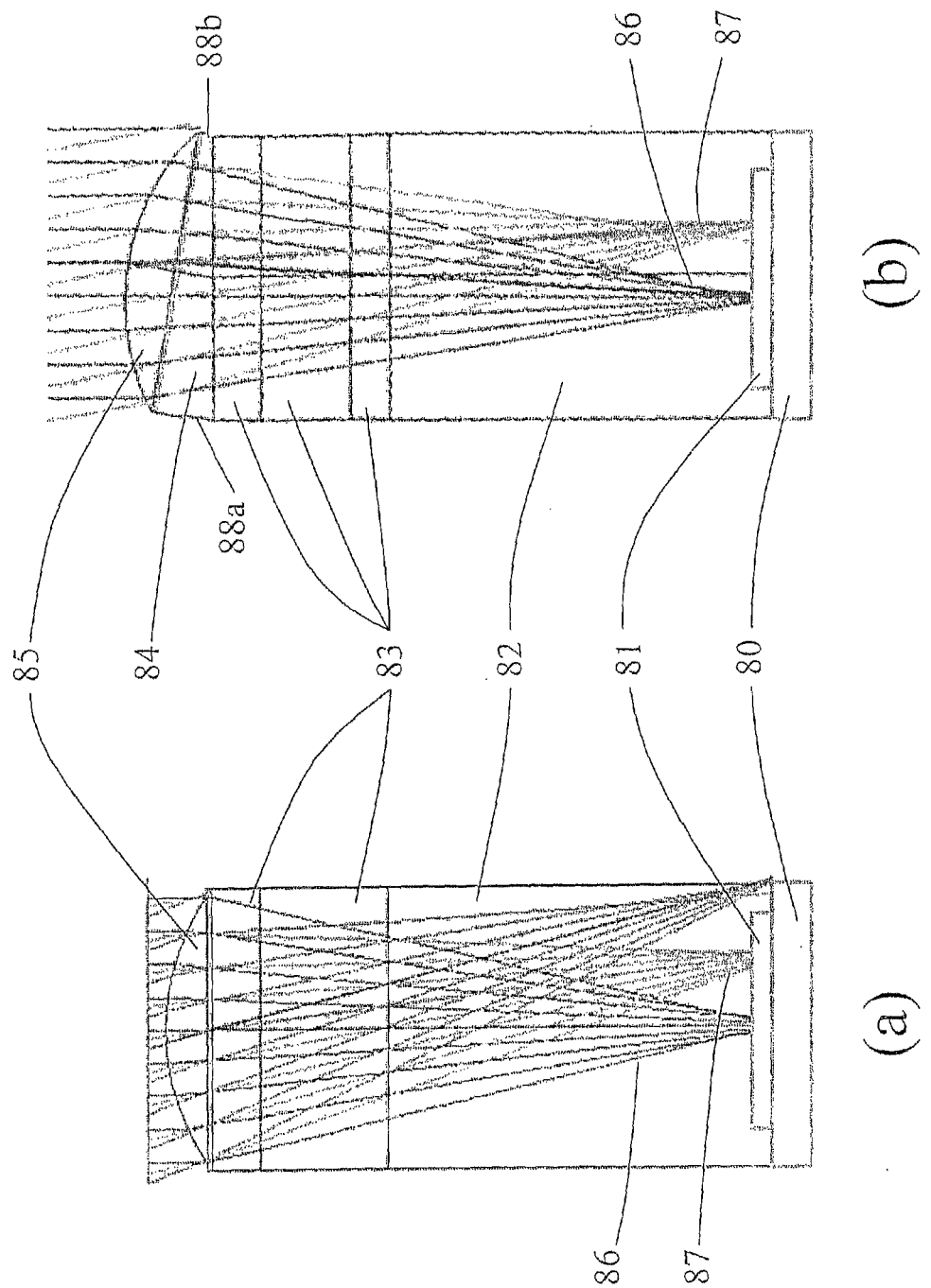
FIG. 8 schematically shows the structure of an image sensor according to a second embodiment of the present invention.

Please refer to FIG. 8, which schematically shows the structure of an image sensor according to a second embodiment of the present invention. Similarly, a conventional image sensor structure is also shown in part (a) of FIG. 8 for explicitly expressing the different features of the image sensor structure according to the second embodiment. In this embodiment, the image sensor structure includes a substrate 80 having a photo sensor 81 and an IC stacking layer 82 sequentially formed thereon. Preferably, the substrate 80, the photo sensor 81 and the IC stacking layer 82 are manufactured by a compatible IC process. Above the IC stacking layer 82, it is incorporated with the optical elements, such as at least one intermediate layer 83, a micro prism 84 and a micro lens 85, which are formed by a compatible integrated optical process. In comparison with the first embodiment of the present invention, the installed micro prism 84 is disposed between the micro lens 85 and the at least one intermediate layer 83. Similarly, with the installation of the micro prism 84, the larger chief ray angle (for example 20°) of an incident light 87 can be adjusted to a smaller one (for example, 0°, which means the direction of the light exiting the exit plane of the micro prism is perpendicular to the exit plane of the micro prism) when the light exits from the micro prism 84, so as to decrease the crosstalk effect among the adjacent pixels.

Figure 9:
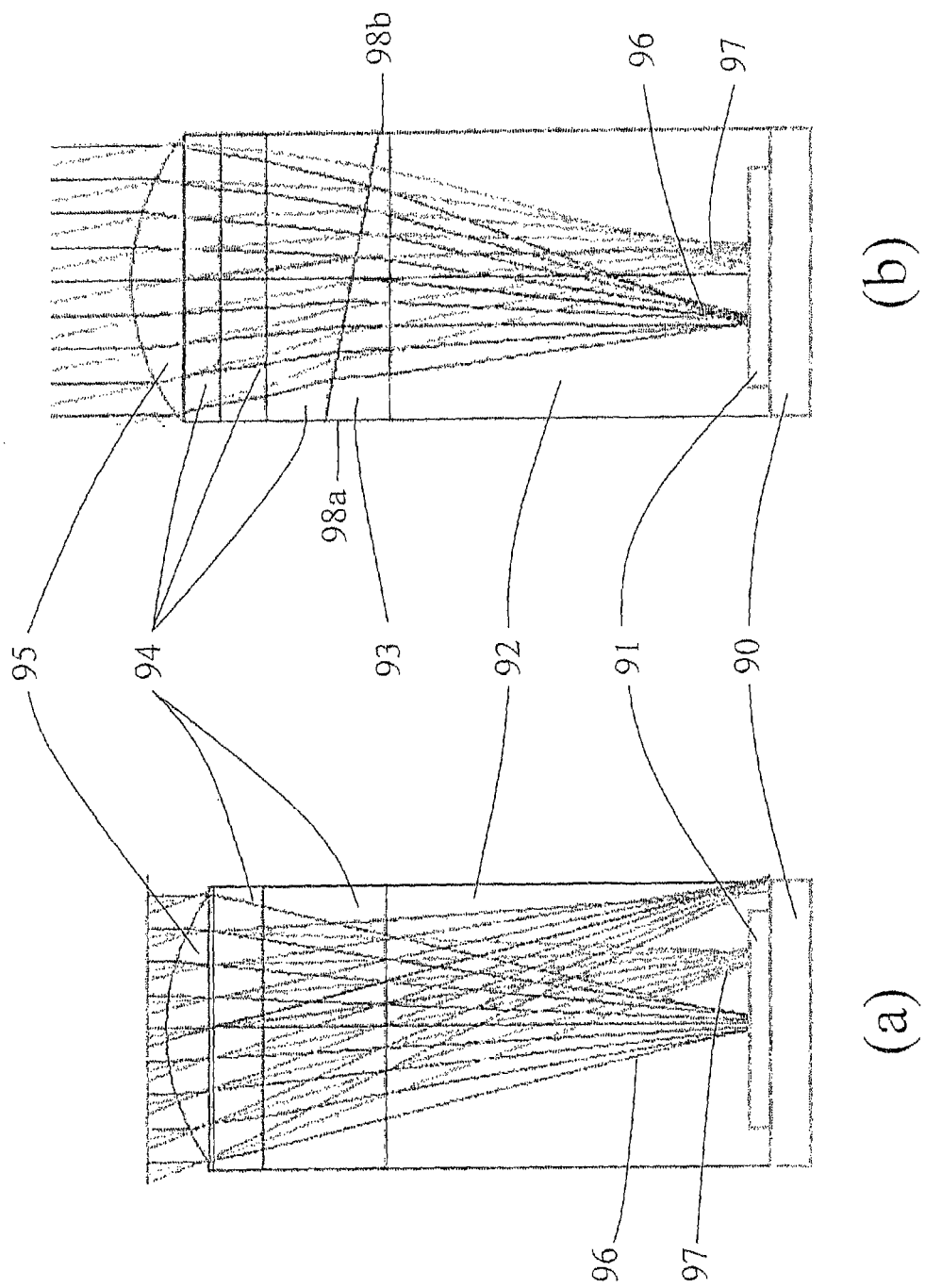
FIG. 9 schematically shows the structure of an image sensor according to a third embodiment of the present invention.

Please refer to FIG. 9, which schematically shows the structure of an image sensor according to a third embodiment of the present invention. Similarly, a conventional image sensor structure is also shown in part (a) of FIG. 9 for explicitly expressing the different features of the image sensor structure according to the third embodiment. In this embodiment, the image sensor structure still includes a substrate 90 having a photo sensor 91 and an IC stacking layer 92 sequentially formed thereon. Preferably, the substrate 90, the photo sensor 91 and the IC stacking layer 92 are manufactured by a compatible IC process. Above the IC stacking layer 92, it is incorporated with the optical elements, such as at least one intermediate layer 94, a micro prism 93 and a micro lens 95, which are formed by a compatible integrated optical process. In comparison with the first and the second embodiments of the present invention, the installed micro prism 93 in the third embodiment of the present invention is disposed below the at least one intermediate layer 94, while the micro lens 95 is disposed above the at least one intermediate layer 94.

Similarly, with the installation of the micro prism 93, the larger chief ray angle (for example 20°) of an incident light 96 can be adjusted to a smaller one (for example, 0°, which means the direction of the light exiting the exit plane of the micro prism is perpendicular to the exit plane of the micro prism) when the light exits from the micro prism 93, so as to decrease the crosstalk effect among the adjacent pixels.

Figure 10:
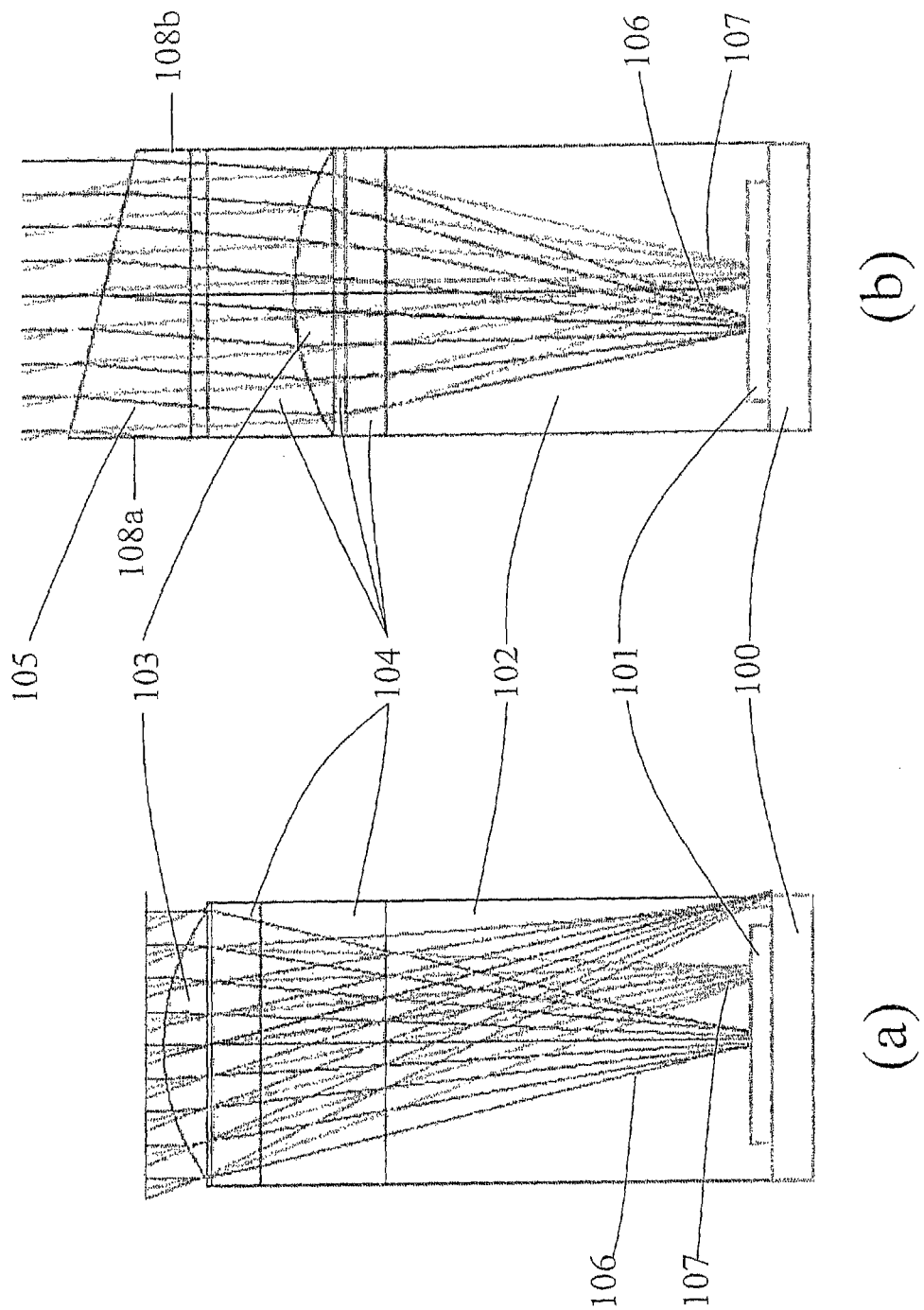
FIG. 10 schematically shows the structure of an image sensor according to a fourth embodiment of the present invention.

Please refer to FIG. 10, which schematically shows the structure of an image sensor according to a fourth embodiment of the present invention. Similarly, a conventional image sensor structure is also shown in part (a) of FIG. 10 for explicitly expressing the different features of the image sensor structure according to the fourth embodiment. In this embodiment, the image sensor structure still includes a substrate 100 having a photo sensor 101 and an IC stacking layer 102 sequentially formed thereon. Preferably, the substrate 100, the photo sensor 101 and the IC stacking layer 102 are manufactured by a compatible IC process. Furthermore, above the IC stacking layer 102, it is incorporated with the optical elements, such as at least one intermediate layer 104, a micro lens 103 and a micro prism 105, which are formed by a compatible integrated optical process. In comparison with the first, the second and the third embodiments of the present invention, the installed micro prism 105 is disposed above the at least one intermediate layer 104 and the micro lens prism is embedded within the intermediate layers 104.

Similarly, with the installation of the micro prism 105 and the disposition of the micro lens 103, the larger chief ray angle (for example 20°) of an incident light 107 can be adjusted to a smaller one (for example, 0°, which means the direction of the light exiting the exit plane of the micro prism is perpendicular to the exit plane of the micro prism) when the light exits from the micro prism 105, so as to decrease the crosstalk effect among the adjacent pixels.

In a preferred embodiment of the present invention, the substrates 70, 80, 90, and 100 used in the abovementioned embodiments are the semiconductor substrates. Furthermore, the photo sensors 71, 81, 91 and 101 embedded in the substrates 70, 80, 90, and 100, respectively, can be any types of photodiodes. The IC stacking layers 72, 82, 92, and 102 include the integrated circuits used for processing the electronic signals generated by the photodiodes.

Moreover, the micro lenses 74, 85, 95, and 103 are formed by the dielectric materials or polymer materials which are pervious to light. Preferably, the micro lenses 74, 85, 95, and 103 are the convex lenses used for converting the incident light in order to increase the absorption of the photo energy in the photo sensor. The micro prisms 75, 84, 93 and 105 are also made of the dielectric material which is pervious to light. As described above, the inclined angle of the micro prisms 75, 84, 93 and 105 can be adjusted by varying the dimensions (78a, 78b; 88a, 88b; 98a, 98b; and 108a, 108b) of the micro prisms. Furthermore, in a preferred embodiment, the abovementioned micro prisms are also made by the silicon oxide, silicon nitride, or silicon oxinitride material and manufactured by one selected from the group consisting of gray masking, photoresist process and etching process.

Furthermore, the intermediate layers 73, 83, 94 and 104 are also made of polymer materials. Preferably, the intermediate layers 73, 83, 94 and 104 are manufactured by depositing one selecting from the group consisting of of the silicon oxide, silicon nitride and silicon oxynitride with PECVD process. In an alternative embodiment, a plurality of spacers and color filters (not shown) are formed within the intermediate layers 73, 83, 94 and 104 for improving the color and image property of the image sensor.

Figure 11:
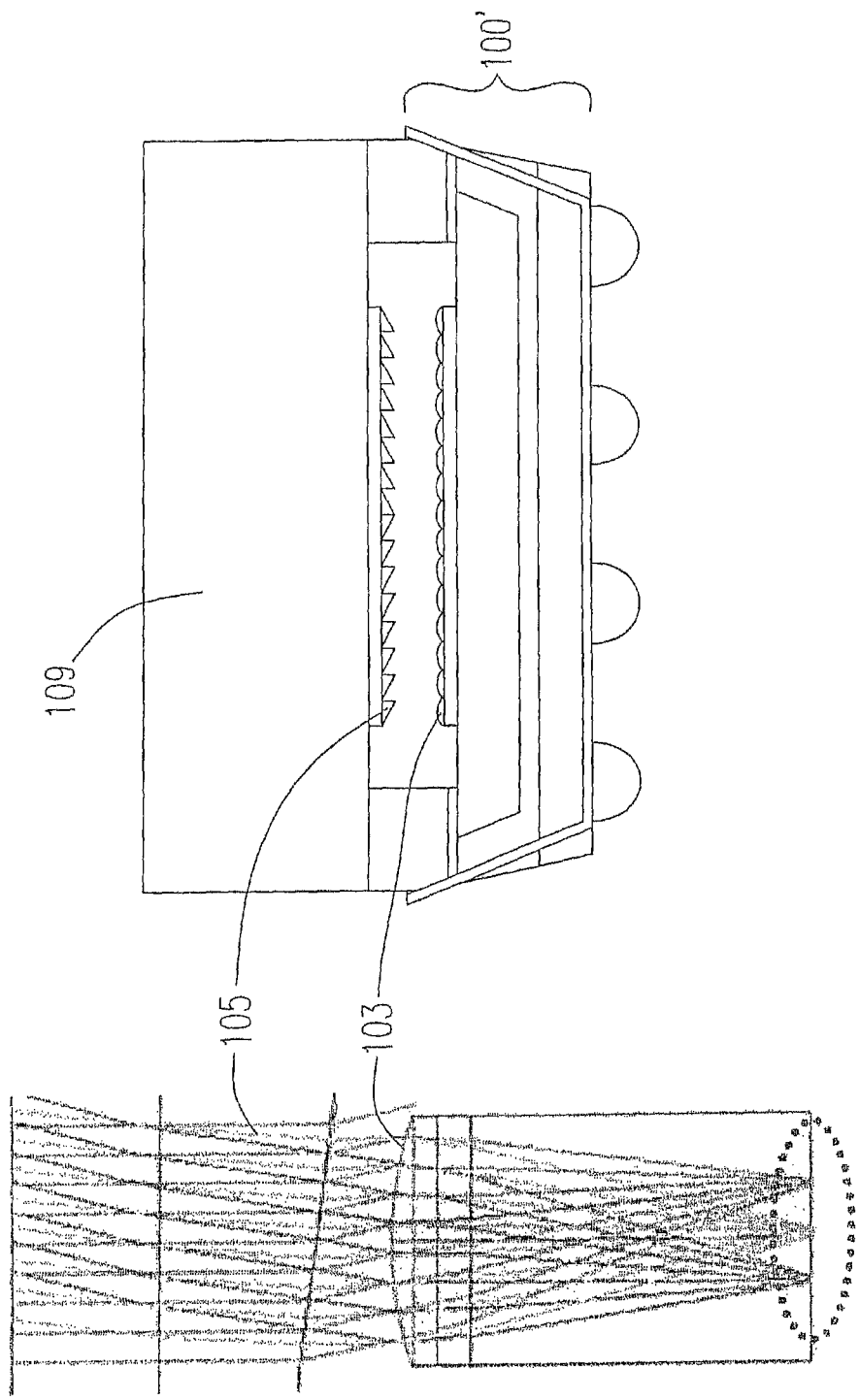
FIG. 11 schematically shows the configuration of an image sensing module according to the fifth embodiment of the present invention.

In a fifth embodiment of the present invention, the micro prism array and a micro lens array can be disposed on separate sides of an image sensing module. Please refer to FIG. 11, which schematically shows the configuration of an image sensing module according to the fifth embodiment of the present invention. As can be seen from FIG. 11, the image sensing module includes a package lid 109 having a micro prism array formed thereon and a substrate 100' having a plurality of photo sensors (i.e. the pixel array, not shown) embedded thereon. On the substrate 100', a micro lens array 103 is formed in such a way that each of the micro lens array 103 is integrated with a corresponding photo sensor and is corresponded to a corresponding micro prism 105. Accordingly, with such a configuration of the photo sensing module, the crosstalk effect and the brightness difference result existing in the conventional photo sensing module can be effectively removed, as shown in the left part of FIG. 11.

Figure 12:
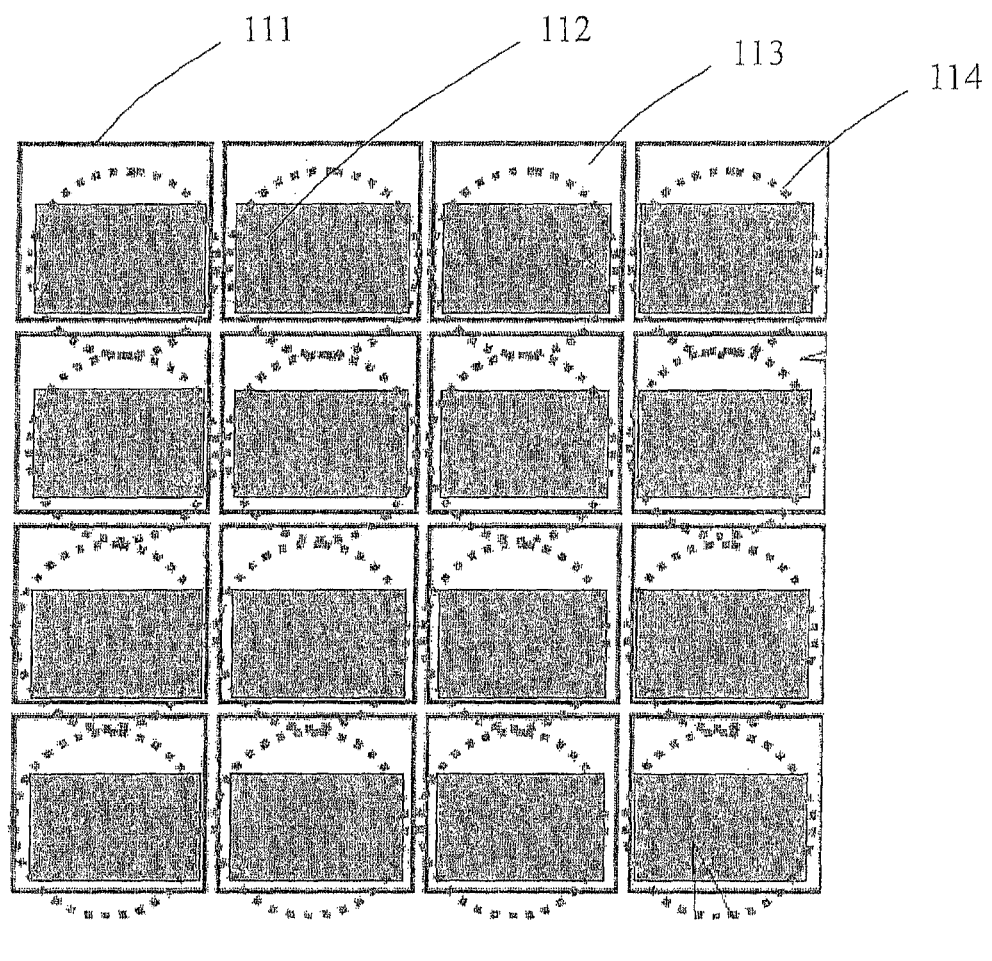
FIGS. 12 and 13 respectively show the top views of two pixel layouts of the COMS image sensor according to the prior art.

As described above, the uniform decenter arrangement (shown in FIG. 12) or the non-uniform decenter arrangement (shown in FIG. 13) of the optical elements in each pixel is well known in the prior art. All these arrangements are also applicable in any embodiments of the present invention.

Figure 14:
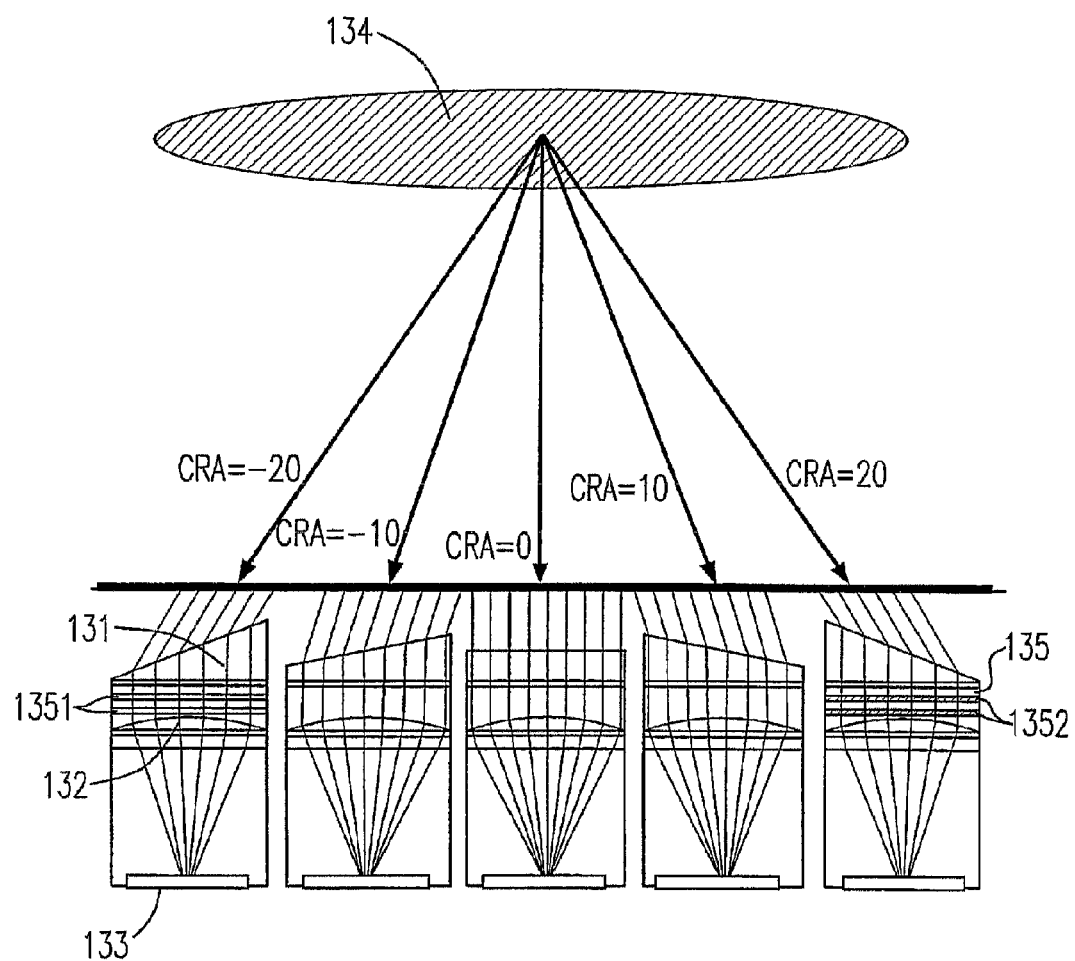
FIG. 14 schematically shows the compact camera module according to the sixth embodiment of the present invention.

Please refer to FIG. 14, which schematically shows the compact camera module according to the sixth embodiment of the present invention. As can be seen from FIG. 14, each pixel of the compact camera module 130 includes a photo sensor 133, an intermediate layer 135, a micro lens 132 and a micro prism 131 constructed as the fourth embodiment of the present invention, wherein the intermediate layer 135 may include a plurality of spacers 1351 or color filters 1352. The main features of the compact camera module according to the sixth embodiment of the present invention are characterized in that the dimension of each micro prism 131 corresponding to each pixel can be varied depending on each pixel position in the chip set of the photo sensor. With such a design, the different incident lights with different CRA can be adjusted by the respective micro prism when the light exits from the micro prism, so as to decrease the crosstalk effect among the adjacent pixels.

Figure 13:
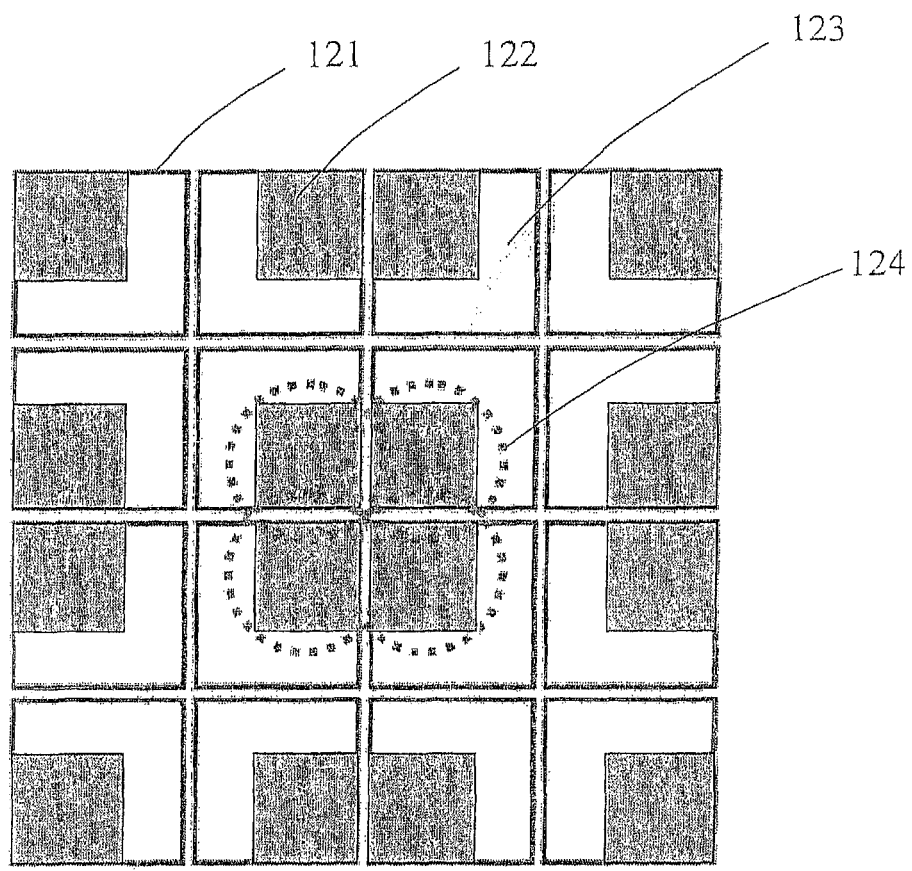
Figure 15:
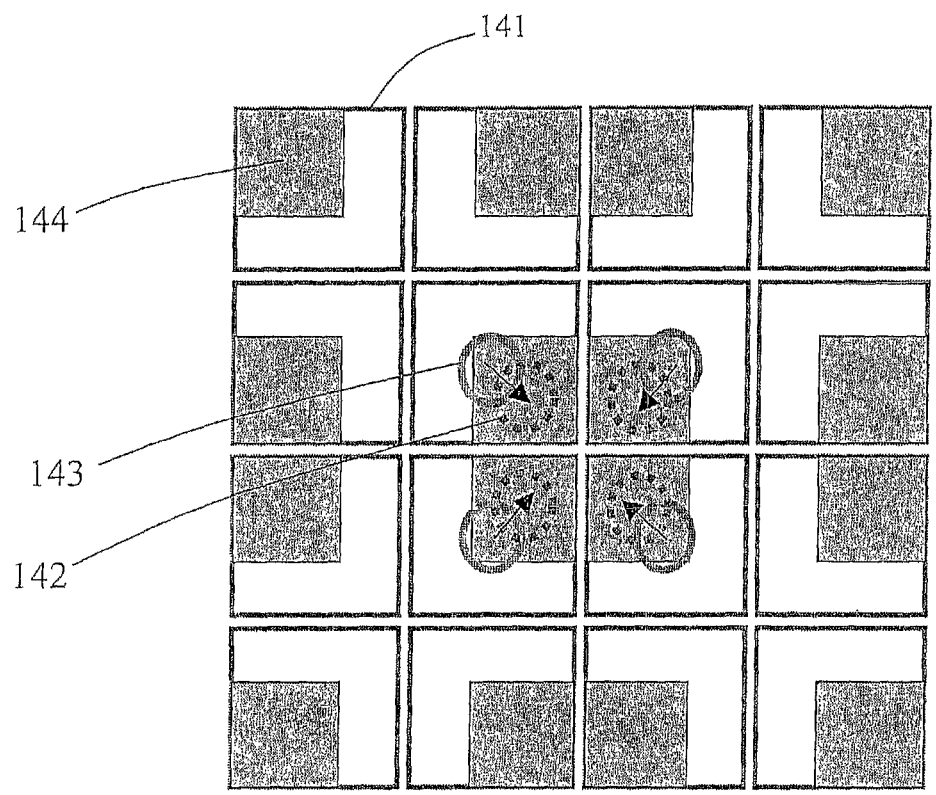
FIG. 15 schematically shows an alternative layout of a pixel array of an image sensing device and the arrangement of the optical elements in each pixel.

Please refer to FIG. 15, which schematically shows an alternative layout of a pixel array of an image sensing device and the arrangement of the optical elements in each pixel. Similar to the pixel array 120 provided in FIG. 13, the pixel layout in FIG. 15 is also configured in an non-uniform decenter arrangement. The main features of the pixel layout 140 according to this embodiment of the present invention are characterized in that each pixel 141 includes a photo sensor 144, a micro lens 143 and a micro prism which are configured in a decenter arrangement. However, with the incorporation of the micro prism, the light spot converged on the photo sensor 144 can be shifted and adjusted by the micro prism, so that the possible overlapped layout of the micro lens array 124, as shown in FIG. 13, can be avoided.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. An image sensing module, comprising:
   a package lid;
   a plurality of micro prisms disposed on said package lid and adjusting an incident angle of an incident light, wherein each of the micro prisms have an inclined angle that is a function of a first side, a second side, and a third side of the micro prism, and wherein each of the micro prisms are configured to deflect light with a chief ray angle entering the micro prism to an exit light which is parallel to a line normal to the third side of the micro prism;
   a plurality of photo sensors converting photo signals of said incident light into electronic signals;
   a plurality of micro lenses coupled to the plurality of photo sensors; and
   an intermediate layer separating the micro lenses and the micro prisms for increasing the refraction of incident light on the micro lenses, wherein the intermediate layer comprises one selected from the group consisting of silicon oxide, silicon nitride and silicon oxynitride.

2. The module according to claim 1, wherein a chief ray angle (CRA) of said incident light is adjusted by varying a dimension of each of said plurality of micro prisms.

3. The module according to claim 1, wherein each of said plurality of micro prisms is formed by one of dielectric material and polymer material.

4. The module according to claim 1, wherein each of said plurality of micro prisms has a width in the order of micrometers.

5. The module according to claim 1, wherein a dimension of each of said plurality of micro prisms is varied with its position in said package lid.

6. The module according to claim 1, wherein said micro prisms each have an inclined angle, said inclined angle is a function of a first side, a second side, and a third side of said micro prism.

7. The module according to claim 6, wherein said micro prism deflects light with a chief ray angle entering said micro prism to an exit light which is parallel to a line normal to said third side of said micro prism.

8. The module according to claim 1, wherein said micro prisms, said micro lenses, and said photo sensors are configured in a decenter arrangement.

9. The module according to claim 7, wherein said decenter arrangement comprises a regular decenter arrangement and an irregular decenter arrangement.

* * * * *